(12) United States Patent
Kawakubo et al.

(10) Patent No.: US 7,471,031 B2
(45) Date of Patent: Dec. 30, 2008

(54) PIEZOELECTRIC MEMS ELEMENT AND TUNABLE FILTER EQUIPPED WITH THE PIEZOELECTRIC MEMS ELEMENT

(75) Inventors: Takashi Kawakubo, Yokohama (JP); Toshihiko Nagano, Kawasaki (JP); Kazuhide Abe, Kawasaki (JP); Michihiko Nishigaki, Kawasaki (JP); Tomio Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 390 days.

(21) Appl. No.: 11/229,694

(22) Filed: Sep. 20, 2005

(65) Prior Publication Data
US 2006/0067840 A1 Mar. 30, 2006

(30) Foreign Application Priority Data
Sep. 24, 2004 (JP) ............................ 2004-278264

(51) Int. Cl.
*H01L 41/09* (2006.01)
(52) U.S. Cl. .................. 310/330; 310/309; 310/331; 310/332; 200/181
(58) Field of Classification Search ................ 310/309, 310/330–332; 200/181
See application file for complete search history.

(56) References Cited

U.S. PATENT DOCUMENTS

| | | | |
|---|---|---|---|
| 2004/0075364 A1* | 4/2004 | Mehta | 310/324 |
| 2005/0194867 A1 | 9/2005 | Kawakubo et al. | |
| 2005/0242687 A1* | 11/2005 | Kawakubo et al. | 310/324 |
| 2006/0055287 A1* | 3/2006 | Kawakubo et al. | 310/348 |
| 2006/0098059 A1* | 5/2006 | Ohguro et al. | 347/72 |
| 2006/0119227 A1* | 6/2006 | Ikehashi | 310/348 |
| 2006/0152111 A1* | 7/2006 | Allison et al. | 310/328 |

FOREIGN PATENT DOCUMENTS

JP 2003-258502 9/2003

OTHER PUBLICATIONS

U.S. Appl. No. 11/196,596, filed Aug. 4, 2005, Takashi Kawakubo et al.
U.S. Appl. No. 11/115,107, filed Apr. 27, 2005, Takashi Kawakubo et al.
U.S. Appl. No. 11/039,872, filed Jan. 24, 2005, Takashi Kawakubo et al.
U.S. Appl. No. 11/151,343, filed Jun. 14, 2005, Abe et al.
U.S. Appl. No. 11/229,694, filed Sep. 20, 2005, Kawakubo et al.

* cited by examiner

*Primary Examiner*—J. San Martin
(74) *Attorney, Agent, or Firm*—Oblon, Spivak, McClelland, Maier & Neustadt, P.C.

(57) ABSTRACT

In a MEMS type variable capacity having a piezoelectric driving mechanism, a movable head having movable electrodes are arranged thereon, stationary electrodes is positioned to face the movable electrodes, and a piezoelectric driving beam structure is joined to the movable head and have one end fixed to the substrate. The movable electrode and the stationary electrode form a variable capacity. In the variable capacity, the distance and capacitance between the movable electrode and the stationary electrode of the variable capacity can be maintained constant so as to realize a reproducibility and a reliable controllability.

19 Claims, 7 Drawing Sheets

PIEZOELECTRIC MEMS ELEMENT AND TUNABLE FILTER EQUIPPED WITH THE PIEZOELECTRIC MEMS ELEMENT

CROSS-REFERENCE TO RELATED APPLICATIONS

This application is based upon and claims the benefit of priority from prior Japanese Patent Application No. 2004-278264, filed Sep. 24, 2004, the entire contents of which are incorporated herein by reference.

BACKGROUND OF THE INVENTION

1. Field of the Invention

The present invention relates to a piezoelectric MEMS (Micro-electro-mechanical System) element and a tunable filter, particularly, to a variable capacity having a piezoelectric driving mechanism utilizing a piezoelectric thin film.

2. Description of the Related Art

A variable capacity/diode utilizing a change in the thickness of the depletion layer in the PN junction is known as a conventional variable capacity or capacitor. However, the variable capacity/diode has a capacitance varying range that is only about 5 times as much as the reference capacitance value, and the quality coefficient (Q value) of the variable capacity/diode denoting the smallness of the loss is small, i.e., about 20 to 30, and, thus, the use of the variable capacity/diode is currently limited.

On the other hand, a variable capacity or capacitor prepared by the MEMS technology attracts attention in recent years. For example, a variable capacity is exemplified in Japanese Patent Disclosure (Kokai) No. 2003-258502. In the variable capacity disclosed in this prior art, a movable body is arranged upward of a coplanar line formed on a substrate, and a movable electrode is mounted to the movable body so as to face the coplanar line. A DC current is applied between the movable electrode and a stationary electrode so as to displace the movable body toward the stationary electrode and, thus, a capacitance between the movable electrode and the coplanar line is varied.

Recently, a MEMS type variable capacity utilizing the piezoelectric reaction as the driving force of a movable beam attracts attention. This variable capacity permits wide and continuous variation of the distance between the movable electrode and the stationary electrode, leading to various merits. For example, it is possible to obtain a high rate of change of capacitance. Also, since air or a gas is used as the dielectric material, it is possible to obtain a large Q value.

Also, it is possible for the variable capacity to be of a capacity type structure in which the movable electrode is brought into contact with the stationary electrode with a very thin dielectric film interposed therebetween or to be of a DC type switch structure in which the movable electrode is brought into direct contact with the stationary electrode. The switch manufactured by the MEMS technology described above permits a low on-resistance and high insulating separating properties in the off-time, compared with a semiconductor switch and, thus, attracts attentions very much.

However, the MEMS type variable capacity has a long and thin beam structure supported in the air and includes a piezoelectric layer sandwiched between upper and lower electrodes. The particular construction gives rise to the problems that a slight residual stress in the material constituting the beam causes the variable capacity to be warped in the vertical direction and that a slight difference in the thickness and the properties of the material constituting the beam causes an amount of displacement generated by the voltage application to be changed. It follows that it is very difficult to maintain the capacitance value before and after the voltage application as designed in the variable capacity and to maintain the same change in the capacitance of a large number of variable capacities.

BRIEF SUMMARY OF THE INVENTION

An object of the present invention is to provide a piezoelectric MEMS element, which permits maintaining constant the distance between the movable electrode and the stationary electrode in a MEMS type variable capacity structure having a piezoelectric driving mechanism so as to make it possible to achieve a reproducible and reliable control, and to provide a tunable filter equipped with this piezoelectric MEMS element.

According to a first aspect of the present invention, there is provided a piezoelectric MEMS element, comprising:

a substrate having a first surface;

a movable head having a second surface faced to the first surface, and movable electrodes arranged on the second surface;

pairs of stationary electrodes formed on the first surface, each of the pairs of stationary electrodes being arranged to face a movable electrode with a gap; and a driving beam structure configured to drive the movable head, the driving beam structure including a piezoelectric film generating a driving force, which is elongated from the movable head to the end of the driving beam structure in a longitudinal direction of the driving beam structure, the end of the driving beam structure being fixed to the substrate to support the movable head, variable capacities being formed between the movable electrode and the stationary electrode, the capacitance of the variable capacity being varied depending on the driving of the movable head.

According to a second aspect of the present invention, there is provided a piezoelectric MEMS element, comprising:

a substrate having a first surface;

a movable head having a second surface faced the first surface, and including movable electrodes which are substantially symmetrically arranged on the second surface with respect to the center point of the movable head;

pairs of stationary electrodes formed on the first surface, each pairs of stationary electrodes being so arranged to face the movable electrode with a gap; and a driving beam structure configured to drive the movable head, the driving beam structure including first, second, third and fourth driving beams arranged in symmetry with respect to the center point of the movable head, each of the first, second, third and fourth driving beams including a piezoelectric film deforming the driving beam structure, which is elongated in a longitudinal direction of corresponding one of the driving beams from the movable head to the end of the corresponding driving beam, the ends of the first, second, third and fourth driving beams being fixed to the substrate to support the movable head, variable capacities being formed between the movable electrode and the stationary electrode, and the capacitance of the variable capacity being varied depending on the driving of the movable head.

According to a third aspect of the present invention, there is provided a piezoelectric MEMS element, comprising:

a substrate having a first surface;

a movable head having a second surface faced to the first surface and movable electrodes which are arranged on the second surface substantially in symmetry with respect to the center point of the movable head;

pairs of stationary electrodes formed on the first surface, each of the pairs of stationary electrodes being arranged to face the movable electrodes with a gap; and a driving beam structure configured to drive the movable head, including first and second driving beams which are extended in opposite directions to support the movable head, each of the first and second driving beams including a piezoelectric film generating a driving force, the piezoelectric element extending in a longitudinal direction of corresponding one of the first and second driving beams from the movable head to the end of the corresponding driving beam, variable capacities being formed between the movable electrode and the stationary electrodes, and the capacitance of the capacities being varied depending on the driving of the movable head.

According to a fourth aspect of the present invention, there is provided a tunable filter, comprising:

input-output line and a ground line;

first resonance circuits connected in series to the input-output line, including a first resonator connected to the input-output line, a first variable capacity connected in parallel to the first resonator, and a second variable capacity connected in series to the first resonator and to the first variable capacity, the first and second variable capacities being formed of first and second piezoelectric MEMS elements, and each of the first and second piezoelectric MEMS elements comprising:

a first substrate having a first surface;

a first movable head having a second surface faced to the first surface and first movable electrodes which are arranged on the second surface;

pairs of first stationary electrodes formed on the first surface, each of the pairs of first stationary electrodes being arranged to face the first movable electrodes with a first gap; and a first driving beam structure configured to drive the first movable head, the driving beam structure including a first piezoelectric film generating a driving force, which is elongated from the movable head to the end of the driving beam structure in a longitudinal direction of the first driving beam structure, the end of the first driving beam structure being fixed to the substrate to support the movable head, one of the first and second variable capacities being formed between the first movable electrode and the first stationary electrodes, and the capacitance of the first and second capacities being varied depending on the driving of the first movable head; and a second resonance circuits arranged between the first resonance circuits and connected between the input-output line and the ground line and including a second resonator connected between the input-output line and the ground line, a third variable capacity connected in parallel to the second resonator, and a fourth variable capacity connected in series to the second resonator and to the third variable capacity, the third and fourth variable capacities being formed of third and fourth piezoelectric MEMS elements, and each of the third and fourth piezoelectric MEMS element comprising:

a second substrate having a third surface;

a second movable head having a fourth surface faced to the third surface and second movable electrodes which are arranged on the fourth surface;

pairs of second stationary electrodes formed on the third surface, each of the pairs of second stationary electrodes being arranged to face the second movable electrodes with a second gap; and a second driving beam structure configured to drive the movable head, the driving beam structure including a second piezoelectric film generating a driving force, which is elongated from the movable head to the end of the second driving beam structure in a longitudinal direction of the second driving beam structure, the end of the first driving beam structure being fixed to the substrate to support the movable head, one of the third and fourth variable capacities being formed between the second movable electrode and the second stationary electrodes, and the capacitance of the third and fourth capacities being varied depending on the driving of the second movable head.

Further, according to a fifth aspect of the present invention, there is provided a tunable filter, comprising:

first and second input terminals;

first and second output terminals;

a bridge circuit including first and second resonance circuits connected between the first input terminal and first and second output terminals and third and fourth resonance circuits connected between the second input terminal and the first and second output terminals, each of the first to fourth resonance circuits being formed of a resonator, a first variable capacity connected in series to the resonator, and a second variable capacity connected in parallel to the series circuit of the resonator and the first variable capacity, the first variable capacity included in each of the first to fourth resonance circuits being formed of a first piezoelectric MEMS element, the first variable capacity included in each of the second and third resonance circuits being formed of a second piezoelectric MEMS element, a second variable capacity included in each of the first and fourth resonance circuits being formed of a third piezoelectric MEMS element, and the second variable capacity included in each of the second and third resonance circuits being formed of a fourth piezoelectric MEMS element, each of the first, second, third and fourth piezoelectric MEMS elements comprising:

a substrate having a first surface;

a movable head having a second surface faced to the first surface and movable electrodes which are arranged on the second surface;

pairs of stationary electrodes formed on the first surface, each of the pairs of stationary electrodes being arranged to face the movable electrodes with a gap; and a driving beam structure configured to drive the movable head, which are extended in opposite directions to support the movable head, each of the first and second driving beams including a piezoelectric film generating a driving force, the piezoelectric element extending in a longitudinal direction of corresponding one of the first and second driving beams from the movable head to the end of the corresponding driving beam, one of the first to fourth variable capacities being formed between the movable electrode and the stationary electrodes, and the capacitance of the capacities being varied depending on the driving of the movable head.

DETAILED DESCRIPTION OF THE INVENTION

The piezoelectric MEMS elements according to some embodiments of the present invention and a tunable filter equipped with the piezoelectric MEMS element will now be described with reference to the accompanying drawings.

First Embodiment

Figure 1:
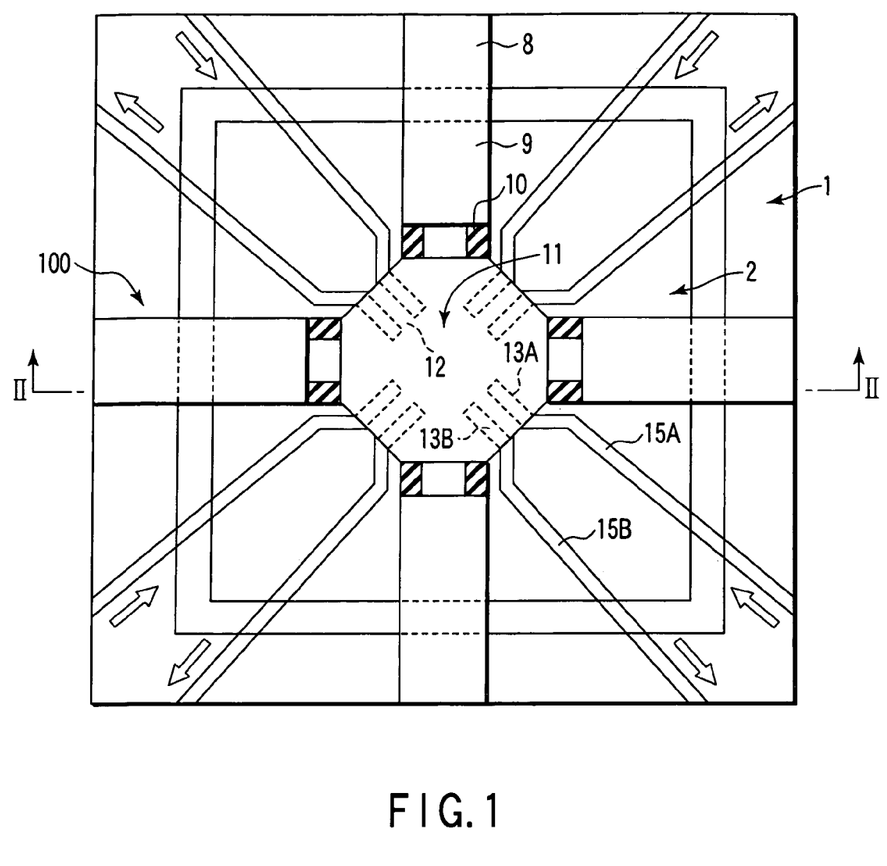
FIG. 1 is a plan view schematically showing the construction of a MEMS type variable capacity having a piezoelectric driving mechanism according to a first embodiment of the present invention.
Figure 2:
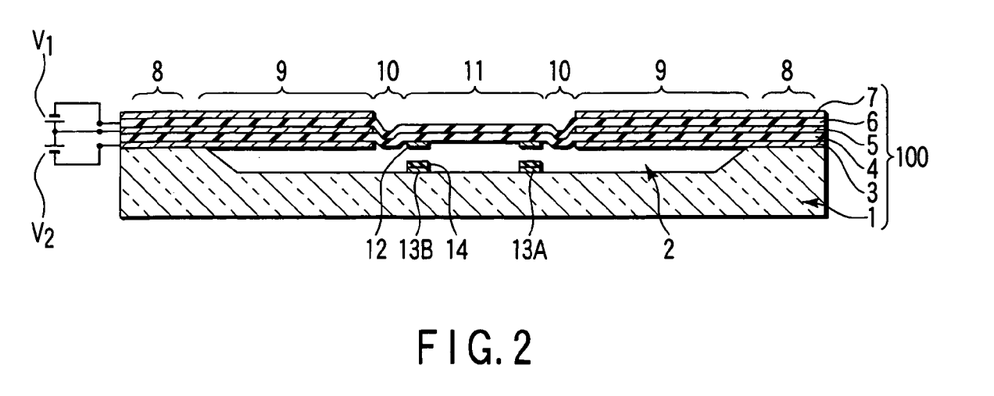
FIG. 2 is a cross-sectional view along the line II-II shown in FIG. 1.

FIG. 1 is a plan view schematically showing the construction of a MEMS type variable capacity or capacitor having a piezoelectric driving mechanism of a beam structure supported on both sides according to a first embodiment of the present invention, and FIG. 2 is a cross sectional view along the line II-II shown in FIG. 1.

As shown in FIG. 1, a recess 2 that is substantially square as viewed from above is formed in an insulating substrate 1. For example, the recess 2 is shaped substantially square. It should be noted, however, the shape of the recess 2 is not limited to a squarer shape. A band-like laminate structure having a so-called "bimorph structure", which constitutes a piezoelectric driving mechanism 100 and is substantially cross-shaped, is formed on the substrate 1 in a manner to cross the space above recess 2. The laminate structure extends from the peripheral region of the substrate 1 surrounding the recess 2 in a manner to form a substantially cross-shaped configuration, as shown in FIG. 1. As shown in FIG. 2, the band-like laminate structure forming the piezoelectric driving mechanism 100 comprises a lower electrode 3, a first piezoelectric film 4 extended to close the recess 2 and formed on the lower electrode 3, an intermediate electrode 5 formed on the first piezoelectric film 4, a second piezoelectric film 6 formed on the intermediate electrode 5, and an upper electrode 7 formed on the second piezoelectric film 6.

In the first embodiment shown in FIG. 1, each of the lower electrode 3, the intermediate electrode 5 and the upper electrode 7 is formed of an Al film having a thickness of 200 nm. On the other hand, each of the first piezoelectric film 4 and the second piezoelectric film 6 is formed of an AlN film oriented in the c-axis and having a thickness of 500 nm. As shown in FIG. 2, the laminate structure comprises a support section 8, a piezoelectric driving section, i.e., driving beam structure 9, a neck section 10 and a movable head 11 positioned in the order mentioned in the longitudinal direction of the laminate structure. In other words, the movable head 11 is positioned to face the central region of the recess 2, and the neck section 10, the piezoelectric driving section 9 and the support section 8 are arranged to extend along the sides of the rectangular recess in a manner to form a cross-shaped configuration so as to support the movable head 11. The support section 8 is fixed to the peripheral surface of the substrate 1 around the recess 2 and the piezoelectric driving section 9 is supported by the support section 8 and extends from the support section 8 into the space above the recess 2. The neck section 10 is positioned between the piezoelectric driving section 9 and the movable head 11. The neck section 10 is formed such that the lower electrode 3, the intermediate electrode 5 and the upper electrode 7 are removed from the laminate structure by the patterning. The central portion is removed to form a void so as to form a laminate structure of the first and second piezoelectric films 4 and 6 and not including a conductive portion as shown in FIG. 1, and the neck section 10 has a curved cross section that is flexible as shown in FIG. 2. Also, the movable head 11 is formed substantially hexagonal on a plane as shown in FIG. 1 and is supported by the piezoelectric driving section 9 via the neck section 10 and has a laminate structure of the first and second piezoelectric films 4 and 6 and not including a conductive section, as shown in FIG. 2.

A movable electrode 12 included in the variable capacity or capacitor is formed on the lower surface of the movable head 11. Also, a pair of stationary electrodes 13A, 13B included in the variable capacity are formed apart from each other on the surface of the substrate 1 within the recess 2 and positioned to face the movable electrode 12. A thin dielectric film 14 is formed on each of the stationary electrodes 13A, 13B. As shown in FIG. 1, the support section 8 and the driving section 9 extend outward in four directions from the movable head 11 in the form of a band. Also, wirings 15A, 15B connected to the pair of stationary electrodes 13A, 13B extend along the surface of the substrate 1 in a direction swung by about 45° from the direction in which the support section 8 and the driving section 9 extend so as to prevent the wirings 15A, 15B from crossing the driving section 9.

If DC voltages V1, V2 of the opposite polarities are applied between the lower electrode 3 and the intermediate electrode 5 and between the intermediate electrode 5 and the upper electrode 7 included in the piezoelectric driving mechanism, respectively, the first piezoelectric film 4 is elongated in the thickness direction substantially perpendicular to the substrate surface and is diminished in the direction of the driving axis corresponding to the longitudinal direction of the laminate structure. Also, the second piezoelectric film is diminished in the thickness direction and is elongated in the direction of the driving axis. As a result, the driving section 9 is deformed upward as a whole so as to cause the movable head 11 to be moved upward in the vertical direction. It follows that the distance between the movable electrode 12 of the variable capacity and the pair of stationary electrodes 13A, 13B formed on the surface of the recess 2 included in the substrate 1 is varied by the voltage application so as to vary the capacitance value between the movable electrode 12 and the stationary electrode 13A, and between the movable electrode 12 and the stationary electrode 13B.

AS shown in FIG. 1, in the MEMS type variable capacity having a piezoelectric driving mechanism, 4 sets of the driving sections 9 acting as an actuator are arranged substantially in symmetry with respect to the center of the movable head 11. It follows that, if the central driving head section 11 acting as a variable capacity is driven, the movable head 11 is rendered movable in a direction perpendicular to the substrate while the movable head 11 is held parallel as a whole to the substrate. Also, four sets of movable electrodes 12 are arranged in the movable head 11 in symmetry with respect to the center of the movable head 11. Even where a stress is exerted in a manner to collapse the symmetrical relationship among the four sets of the piezoelectric driving sections 9 with respect to the movable head 11, the movable head 11 can be held parallel to the substrate because this movable electrodes 12 are also arranged in symmetry with respect to the center of the movable head 11. It follows that all the movable electrodes 12 exhibit a similar behavior and change in capacitance relative to the stationary electrodes 13A, 13B positioned to face the movable electrode 12, with the result that four variable capacities have a net effect of enabling stable overall control.

The capacitance of the four sets of the variable capacities was measured by applying a control voltage (Vtune) of 0~3V between the lower electrode 3 and the intermediate electrode 5, and a control voltage of 0~−V between the intermediate electrode 5 and the upper electrode 7, with the result that a high uniform change in capacitance was obtained continuously such that the minimum capacitance was found to be 0.213±0.002 pF and the maximum capacitance was found to be 51.8±0.7 pF.

Second Embodiment

Figure 3:
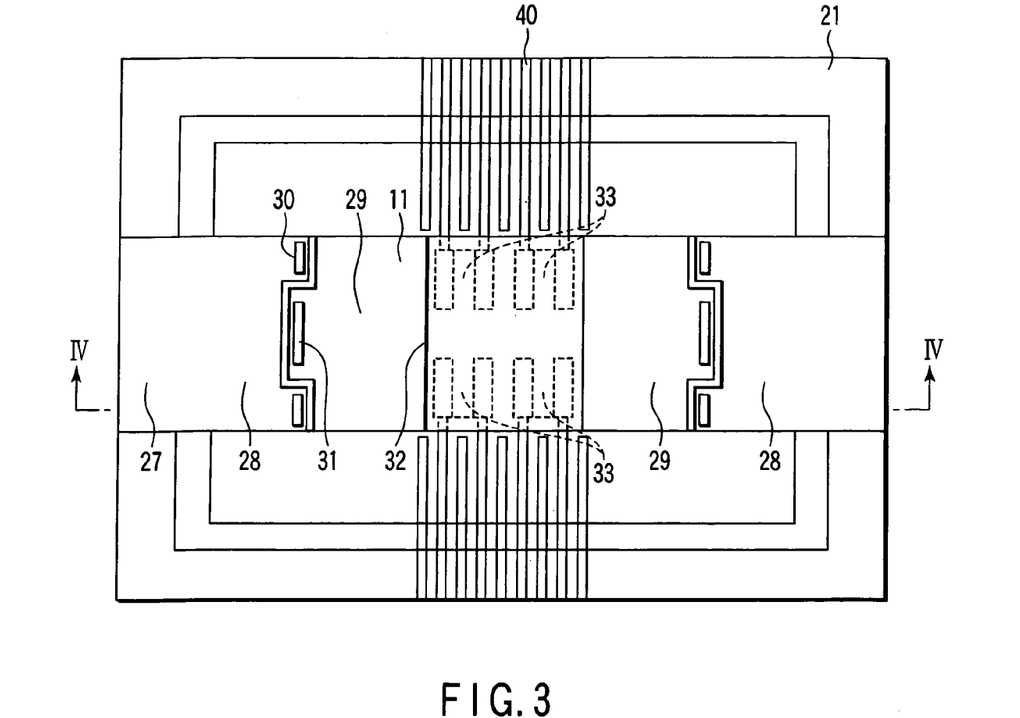
FIG. 3 is a plan view schematically showing the construction of a MEMS type variable capacity having a piezoelectric driving mechanism according to a second embodiment of the present invention.
Figure 4:
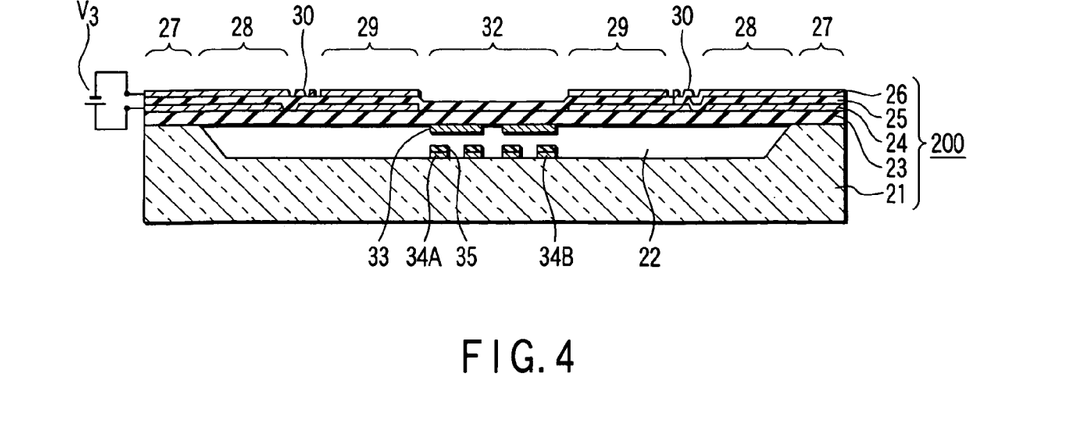
FIG. 4 is a cross-sectional view along the line IV-IV shown in FIG. 3.

A piezoelectric driving MEMS type variable capacity or capacitor according to a second embodiment of the present invention will now be described with reference to FIGS. 3 and 4. FIG. 3 is a plan view schematically showing the construction of a MEMS type variable capacity having a piezoelectric driving mechanism of a beam structure supported on both sides, and FIG. 4 is a cross-sectional view along the line IV-IV shown in FIG. 3.

As shown in the drawings, a recess 22 that is substantially oblong as viewed from above is formed in the upper surface region of an insulating substrate 21. In this embodiment, the recess 22 is shaped substantially oblong. However, the recess 22 is not limited to an oblong recess. Formed above the recess 22 included in the substrate 21 is a so-called "unimorph structure", i.e., a laminate structure constituting a piezoelectric driving mechanism 200 and of a support film 23, a lower electrode 24, a piezoelectric film 25, and an upper electrode 26, which are laminated one upon the other in the order mentioned. In this embodiment, each of the lower electrode 24 and the upper electrode 26 is formed of an Al film having a thickness of 200 nm. Also, the piezoelectric film 25 is formed of an AlN film oriented in the c-axis and having a thickness of 500 nm. The laminate structure includes a support section 27, a first piezoelectric driving section, i.e., driving beam structure 28, a second piezoelectric driving section, i.e., driving beam structure 29 and a movable head 32 like the laminate structure shown in FIGS. 1 and 2. The support section 27 is fixed to the peripheral region of the substrate 21 surrounding the recess 22. The first piezoelectric driving section 28 is arranged above the recess 22 and joined to the support section 27. The second piezoelectric driving section 29 is also positioned above the recess 22 and joined to the first piezoelectric driving section 28. Further, the movable head 32 is arranged above the central region of the recess 22 and joined to the second piezoelectric driving section 29 so as to be supported swingable by the first piezoelectric driving section 28 and the second piezoelectric driving section 29. In other words, the movable head 32 arranged above the central region of the recess 22 is suspended movable by the first piezoelectric driving section 28, the second piezoelectric driving section 29 and the support section 27 fixed to peripheral region of the substrate 21.

Also, a first via hole 30 and a second via hole 31 are formed in that portion of the piezoelectric film 25 which is positioned between the first piezoelectric driving section 28 and the second piezoelectric driving section 29. The first via hole 30 permits the upper electrode 26 of the first piezoelectric driving section 28 to be connected to the lower electrode 24 of the second piezoelectric driving section 29, and the second via hole 31 permits the upper electrode 26 of the second piezoelectric driving section 29 to be connected to the lower electrode 24 of the first piezoelectric driving section 28. By this connection, the laminate structure of the first piezoelectric driving section 28 and the second piezoelectric driving section 29 constitutes a double clamp bridge, with the result that the first piezoelectric driving section 28 and the second piezoelectric driving section 29 are deformed in opposite directions so as to drive the movable head 32 in an S mode.

A movable electrode 33 of the variable capacity or capacitor is formed on the lower surface of the movable head 32. Also, stationary electrodes 34A, 34B of the variable capacity are formed on the surface of the recess 22 in a manner to face the movable electrode 33. Further, a thin dielectric film 35 is formed on surface of each of the stationary electrodes 34A and 34B.

In the second embodiment, the first piezoelectric driving sections 28 and the second piezoelectric driving sections 29 are arranged in symmetry with respect to the movable head 32 as shown in FIG. 3. Wirings 40 connected to the stationary electrodes 34A, 34B extend in a direction substantially perpendicular to the extending direction of the first piezoelectric driving section 28 and the second piezoelectric driving section 29. In other words, the extending direction of the wiring 40 makes an angle of substantially 90° with the extending direction of the first and second piezoelectric driving sections 28 and 29 so as to prevent the wirings 40 from crossing the first piezoelectric driving section 28 and the second piezoelectric driving section 29.

If a DC voltage V3 is applied between the lower electrode 24 and the upper electrode 26 included in the piezoelectric driving mechanism, the piezoelectric film 25 included in the first piezoelectric driving section 28 is shrunk in the film thickness direction and elongated in the direction of the driving axis so as to cause the first piezoelectric driving section 28 to be deformed upward. Also, the piezoelectric film included in the second piezoelectric driving section 29 is elongated in the film thickness direction and is shrunk in the direction of the driving axis so as to cause the second piezoelectric driving section 29 to be deformed downward. It follows that the first piezoelectric driving section 28 and the second piezoelectric driving section 28 are deformed to form an S-shape as a whole. It follows that the movable head can be moved in a direction perpendicular to the substrate while being held parallel to the substrate. It should be noted that the distance between the movable electrode 33 and the stationary electrode 34 in the variable capacity is changed by the application of the voltage V3 so as to vary the capacitance value.

In the MEMS type variable capacity having the piezoelectric driving mechanism according to the second embodiment of the present invention, the two sets of the first piezoelectric driving sections 28 and the second piezoelectric driving sections 29 are arranged in symmetry with respect to the movable head 32. If the movable head 32 arranged in the center is driven, the movable head 32 is held parallel as a whole to the substrate and can be moved in a direction perpendicular to the substrate 21. Also, two sets of the movable electrodes 33 of the variable capacity are arranged in symmetry with respect to the center of the movable head 32. Even where a stress is exerted in a manner to destroy the symmetry between the pair of the first piezoelectric driving sections 28 and between the pair of the second piezoelectric driving sections 29 with respect to the movable head 32, the movable head 32 can be held parallel to the substrate because the movable electrodes 33 are also arranged in symmetry with respect to the center of the movable head 32. It follows that all the movable electrodes 33 exhibit a similar behavior and the change in the capacitance relative to the stationary electrodes 34A, 34B positioned to face the movable electrode 33, with the result that four variable capacities permit have a net effect of enabling stable control.

The capacitance of the four sets of the variable capacities was measured by applying a control voltage (Vtune) of 0~3V between the lower electrode 3 and the intermediate electrode 5, and a control voltage of 0~−3V between the intermediate electrode 5 and the upper electrode 7, with the result that a highly uniform change in capacitance was obtained continuously such that the minimum capacitance was found to be 0.348±0.003 pF and the maximum capacitance was found to be 75.3±0.8 pF.

Third Embodiment

Figure 5:
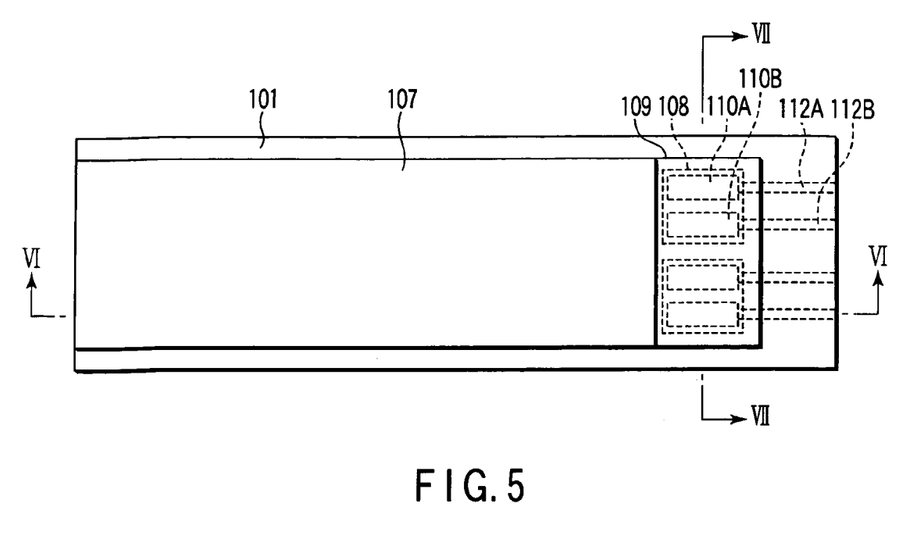
FIG. 5 is a plan view schematically showing the construction of a MEMS type variable capacity having a piezoelectric MEMS element according to a third embodiment of the present invention.
Figure 6:
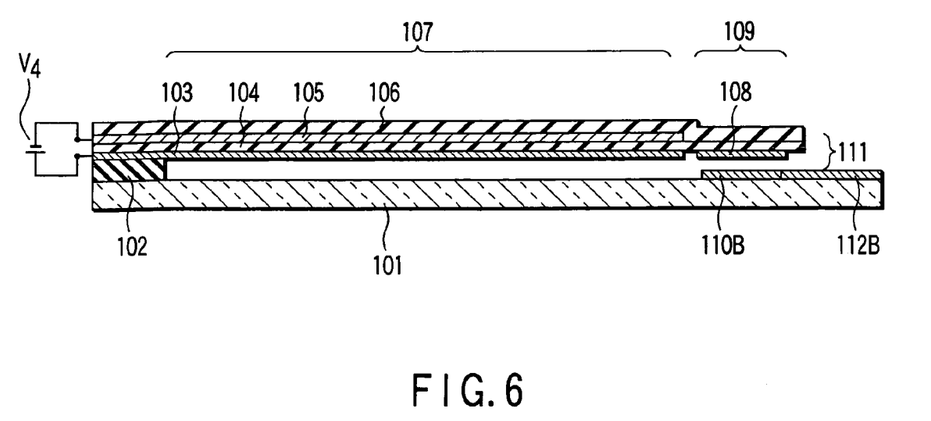
FIG. 6 is a cross-sectional view along the line VI-VI shown in FIG. 5.

A piezoelectric driving MEMS type variable capacity or capacitor according to a third embodiment of the present invention will now be described with reference to FIGS. 5 and 6. FIG. 5 is a plan view schematically showing the construction of a piezoelectric driving MEMS type variable capacity having a piezoelectric driving mechanism of a cantilever structure, and FIG. 6 is a cross-sectional view along the line VI-VI shown in FIG. 5.

As shown in the drawing, a so-called "unimorph structure", i.e., the laminate structure in the driving section, i.e. driving beam structure 107 including a lower electrode 103, a piezoelectric film 104, an upper electrode 105, and a support film 106, is formed on an insulating substrate 101 with an anchor 102 used as a fulcrum. In this Embodiment, each of the lower electrode 103 and the upper electrode 105 is formed of an Al film having a thickness of 200 nm. Also, the piezoelectric film 104 is formed of an AlN film oriented in the c-axis and having a thickness of 500 nm.

A movable head 109 having a movable electrode 108 of two variable capacities on the lower surface is formed at the tip of the driving section 107. Also, stationary electrodes 110A, 110B of two variable capacities positioned to face the movable electrode 108 are formed on those portions of the substrate surface which are positioned to face the movable electrode 108. Further, the stationary electrodes 110A, 110B are connected, respectively, to stationary electrode wirings 112A, 112B of the variable capacity. The two stationary electrodes 110A, 110B positioned to face the stationary electrode 108 serve to form a pair of capacities connected in series and the pair of capacities connected in series are connected between the stationary electrode wirings 112A and 112B.

If a DC voltage V4 is applied between the lower electrode 103 and the upper electrode 105 of the piezoelectric driving mechanism, the piezoelectric film 104 is elongated in the film thickness direction and shrunk in the direction of the driving axis so as to cause the driving section 107 to be deformed upward and, thus, the movable head 109 is moved toward the substrate 101. It follows that the distance between the movable electrode 108 and the stationary electrodes 110A, 110B is varied by the voltage application so as to vary the capacitance value of the variable capacity 111.

In the piezoelectric driving mechanism in this Embodiment, the driving section 107 is deformed in a convex form by application of the driving voltage, with the result that the movable head 109 is inclined so as to be moved toward the substrate, as shown in FIG. 5. Since the movable electrode 108 of the two variable capacities is arranged perpendicular to the driving axis of the piezoelectric driving mechanism and parallel to the substrate surface, a similar behavior and a change in capacitance are exhibited between the stationary electrodes positioned to face the two movable electrodes even where the movable head 109 is inclined. Incidentally, the capacitance of each of the variable capacities is equal to the capacitance of a series connection of the capacity formed between the stationary electrode 110A and the movable electrode 108 and the capacity formed between the movable electrode 108 and the stationary electrode 110B.

Also, the stationary electrodes 110A, 110B are connected directly to the stationary electrode wirings 112A, 112B, respectively, formed in the same size on the substrate 102, and are quite independent of the structure of the driving section 107 and the voltage applied to the lower electrode 103 and to the upper electrode 105 so as to suppress the parasitic capacitance and the parasitic resistance. It is also possible to design the parasitic characteristics of the two variable capacities on exactly the same basis.

The capacitance of the two sets of the variable capacities were measured by applying a voltage of 0~3V between the lower electrode 103 and the upper electrode 105, with the result that a very uniform change in capacitance was obtained continuously such that the minimum capacitance was found to be 25.6 and 26.1 pF and the maximum capacitance was found to be 189.8 and 191.0 pF.

Figure 7:
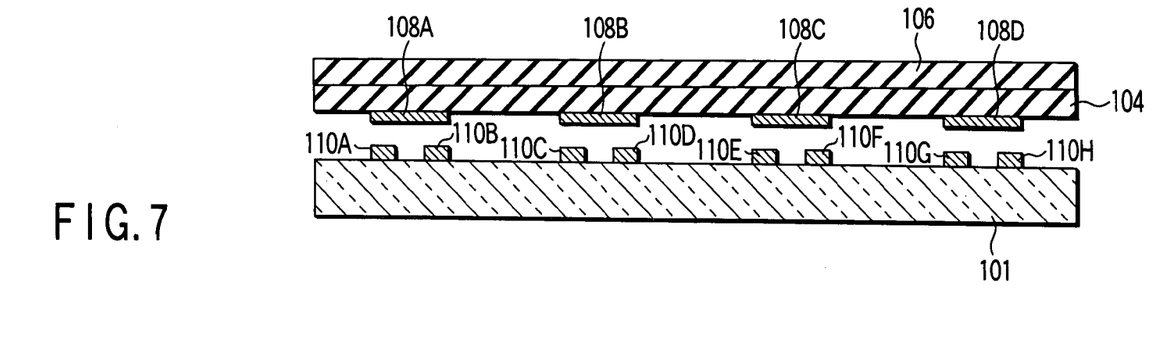
FIG. 7 is a cross-sectional view schematically showing the construction of a head at the time when the piezoelectric MEMS element of a cantilever structure is moved in parallel in the MEMS type variable capacity shown in FIG. 5.

In the variable capacity shown in FIGS. 5 and 6, the driving section 107 tends to be deformed as shown in FIG. 7, and the warped deformation tends to cause the movable electrodes 108A to 108D not to be moved in parallel to the substrate 101 such that the movable electrodes 108A to 108D tend to face the stationary electrodes 110A to 110H in an inclined manner. In order to cope with the warped deformation of the driving section 107, it is desirable for the stationary electrodes 110A to 110H to be connected as shown in FIG. 8.

Figure 8:
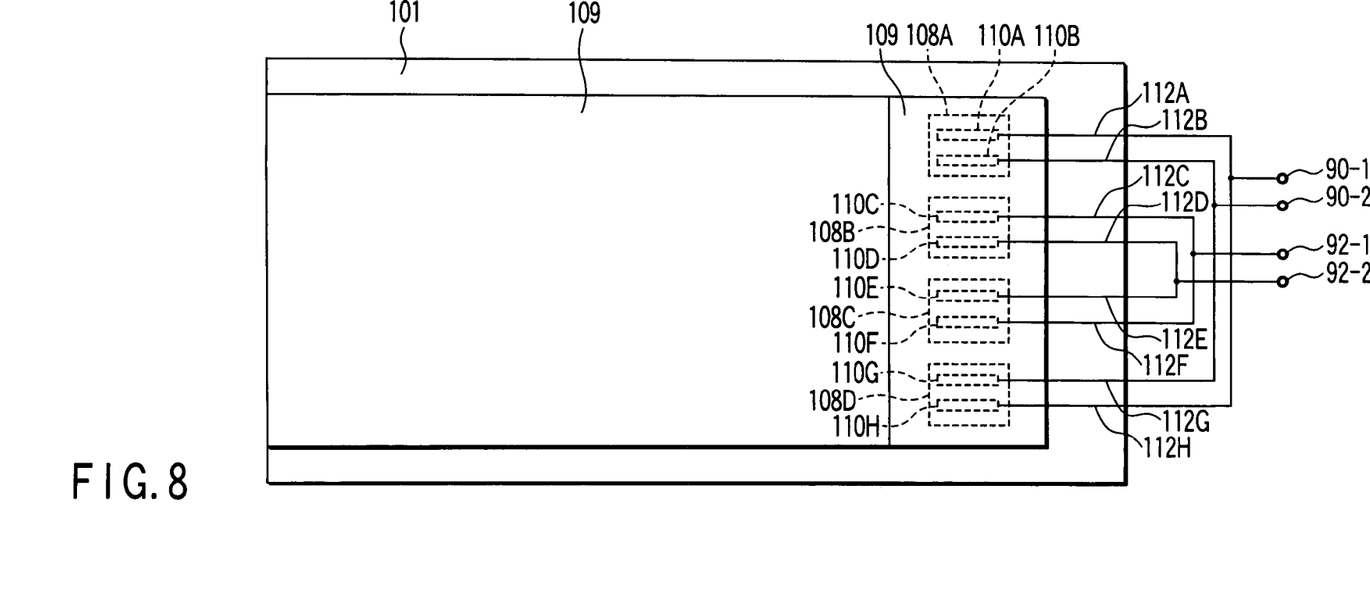
FIG. 8 is a plan view schematically showing a desirable wiring in the MEMS type variable capacity shown in FIG. 7.

In the construction of the variable capacity shown in FIG. 8, the stationary electrodes 110A and 110H arranged on the outermost circumferential surface of the movable head 109 in a manner to face the movable electrodes 108A and 108D, respectively, which are also arranged on the outermost circumferential surface of the movable head 109 are connected to each other via the wirings 112A and 112H, and the junction between the wirings 112A and 112H is connected to a first input terminal 90-1. Also, the stationary electrodes 110B and 110G arranged inside the stationary electrodes 110A and 110H in a manner to face the movable electrodes 108A and 108D are connected to each other via the wirings 112B and 112G, respectively, and the junction between the wirings 112B and 112G is connected to a second input terminal 90-2.

Likewise, stationary electrodes 110C and 110F, which are positioned to face the movable electrodes 108B and 108C arranged inside the movable electrodes 108A and 108D, are connected to each other via the wirings 112C and 112F, respectively, and the junction between the wirings 112C and 112F is connected to a third input terminal 92-1, and stationary electrodes 110D and 110E arranged inside the stationary electrodes 110C and 110F, respectively, in a manner to face the movable electrodes 108B and 108C are connected to each other via the wirings 112D and 112E, respectively, and the junction between the wirings 112D and 112E is connected to a fourth input terminal 92-2. Because of the particular connection, the capacities connected in series and in parallel between the first and second input terminals 90-1 and 90-2 can be set substantially equal to the capacities connected in series and in parallel between the third and second terminals 90-3 and 90-2 even if the movable electrodes 108A to 108D are driven in an inclined manner. To be more specific, where the movable head 109 is inclined as shown in FIG. 7, the movable electrode 108A is arranged closest to the substrate 101, compared with the other movable electrodes 108B, 108C, and 108D. On the other hand, the movable electrode 108D is arranged most apart from the substrate 101, compared with the other electrodes 108A, 10B, and 108C. It follows that the capacity formed between the movable electrode 108A and the stationary electrodes 110A, 110B has the largest capacitance, and the capacity formed between the movable electrode 108D and the stationary electrodes 110G, 110H has the smallest capacitance. The resultant capacity formed by connecting these two capacities is substantially equal to the resultant capacity formed by combining the capacity formed between the movable electrode 108B and the stationary electrodes 110C, 110D and the capacity formed between the movable electrode 108C and the stationary electrodes 110E, 110F. In the construction shown in FIG. 8, formed are four capacities connected in series and in parallel. Further, in the case of forming a large number of capacities connected in series and in parallel, it is possible to permit the resultant capacities to be substantially equal to each other in capacitance, if the capacities formed in the outermost circumferential surface are connected to each other, and the capacities formed inside the capacities noted above are successively connected to each other in the fashion described above with reference to FIG. 8.

Fourth Embodiment

Figure 9:
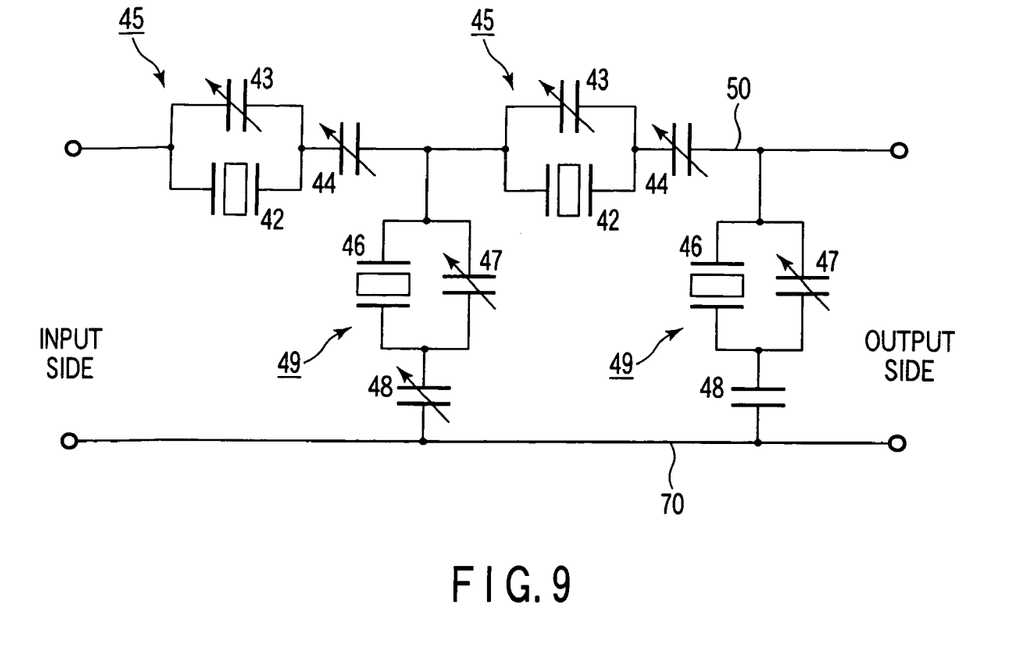
FIG. 9 is a circuit diagram of a ladder type filter using the MEMS type variable capacity having the a piezoelectric driving mechanism according to a fourth embodiment of the present invention.

FIG. 9 is a circuit diagram showing the construction of a ladder type tunable filter utilizing the piezoelectric driving MEMS variable capacity or capacitor according to a fourth embodiment of the present invention.

In the ladder type tunable filter shown in FIG. 9, two sets of series-connected resonance circuits 45 are connected in series to an input-output line 50, and two sets of parallel-connected resonance circuits 49 are connected in parallel between the input-output line 50 and a ground line 70.

The resonance circuit 45 of the serial arrangement comprises a resonator 42 of the serial arrangement, a parallel connected variable capacity 43 of a serial arrangement, which is connected in parallel to the resonator 42, and a series-connected variable capacity 44 of the serial arrangement, which is connected in series to the resonator 42. On the other hand, the resonator 49 of the parallel arrangement comprises a resonator 46 of a parallel arrangement, which is connected between the input-output line 50 and the ground line 70, a parallel-connected variable capacity 47 of the parallel arrangement, which is connected in parallel to the resonator 46, and a series-connected variable capacity 48 of the parallel arrangement, which is connected in series to the resonator 46.

It is desirable to use an elastic surface wave resonator (SAW resonator) or a thin film piezoelectric resonator (FBAR) as the resonators 42 and 46 included in the resonance circuit of the serial arrangement and the parallel arrangement. Also, it is possible to obtain desirable filter characteristics by setting the resonance frequency of the resonator 42 of the serial arrangement at a level somewhat higher than the resonance frequency of the resonator 46 of the parallel arrangement. For example, it is advisable to set the resonance frequency of the resonator 42 of the serial arrangement at 2.05 GHz and to set the resonance frequency of the resonator 46 of the parallel arrangement at 2.01 GHz.

In the circuit shown in FIG. 9, the same capacitance is imparted to the variable capacity 43 that is connected in parallel to the resonator 42 in the two resonance circuits 45 of the serial arrangement, and the capacitances can be tuned at substantially same. It follows that, the two variable capacities 43 shown in FIG. 9 are formed of the MEMS type variable capacity elements 1 on the same substrate, in which the capacitance is tuned by the piezoelectric driving mechanism shown in FIGS. 1 to 8. Where a circuit is further added to the resonance circuit 45 of the serial arrangement so as to increase the number of stages, it suffices for the variable capacities 43, the number of which corresponds to the number of stages, to be formed in a single MEMS type variable capacity element 1. Similarly, in the circuit shown in FIG. 9, the same capacitance is imparted to the variable capacity 44 that is connected in series to the resonator 42 in each of the two resonance circuits 45 of the serial arrangements, and the capacitances can be tuned at substantially same. Each of the two variable capacities 44 shown in FIG. 9 is formed of the MEMS type variable capacity element 1, and these two variable capacities 44 are formed on the same substrate, in which the capacitances can be tuned by the piezoelectric driving mechanism shown in FIGS. 1 to 8. Where the resonance circuit 45 is further added to the circuit so as to increase the number of stages, it suffices for the variable capacities 43, the number of which corresponds to the number of stages, to be formed in a single MEMS type variable capacity element 1.

Also, in the two resonance circuits 49 of the serial arrangement shown in FIG. 9, the same capacitance is imparted to the variable capacity 47, and the capacitances can be tuned at substantially same. It follows that the two variable capacities 47 shown in FIG. 9 is formed of the MEMS type variable capacity element 1 formed on the same substrate, in which the capacity is tuned by the piezoelectric driving mechanism shown in FIGS. 1 to 8. Where the resonance circuit 49 of the parallel arrangement is further added to the circuit so as to increase the number of stages, it suffices for the variable capacities 47, the number of which corresponds to the number of stages, to be formed in the single MEMS type variable capacity element 1. Similarly, in the two resonance circuits 49 of the parallel arrangement shown in FIG. 9, the same capacitance is imparted to the variable capacity 48 connected in series to the resonator 46, and the capacitance is always tuned the same. It follows that the two variable capacities shown in FIG. 9 are formed of the MEMS type variable capacity element 1 on the same substrate, in which the capacity is tuned by the piezoelectric driving mechanism shown in FIGS. 1 to 8. Where the resonance circuit 49 is further added to the circuit so as to increase the number of stages, it suffices for the variable capacity 48, the number of which corresponds to the number of stages, to be formed in the single MEMS type variable capacity element 1.

Figure 10:
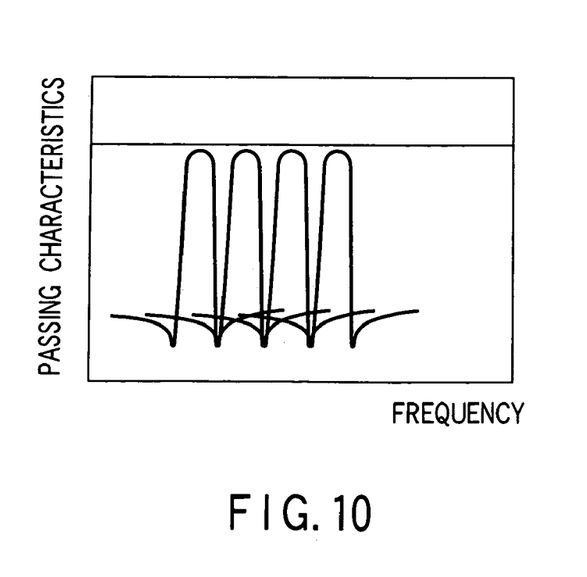
FIG. 10 is a graph showing the frequency characteristics of the circuit shown in FIG. 5.

In the circuit described above, each pair of the variable capacities 43, 43 are required to be varied by the same capacitance relative to the respective driving voltage, and it is confirmed that the MEMS type variable capacity element 1 satisfies this particular requirement. FIG. 10 is a graph showing the filter characteristics the two variable capacities for the first and second embodiments. As apparent from the graph, good tunable filter characteristics are obtained as shown in FIG. 10 by applying a driving voltage calculated in advance.

Fifth Embodiment

Figure 11:
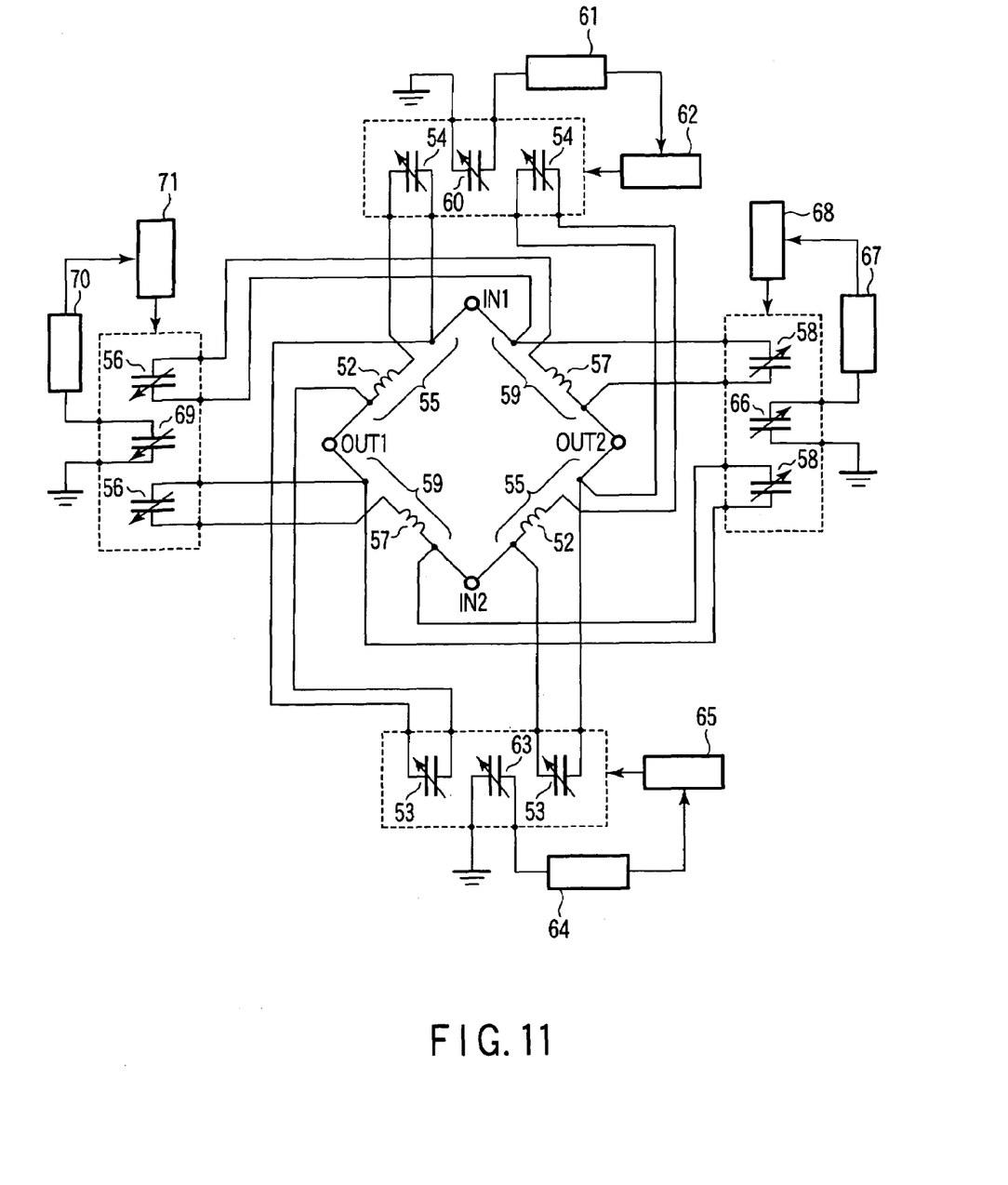
FIG. 11 is a circuit diagram of a lattice type filter in which is incorporated a MEMS type variable capacity including a piezoelectric driving mechanism according to a fifth embodiment of the present invention and a monitor circuit.

FIG. 11 is a circuit diagram showing the lattice type tunable filter using the MEMS type variable capacity or capacitor equipped with the piezoelectric driving mechanism according to a fifth embodiment of the present invention.

In the lattice type tunable filter shown in FIG. 11, first resonance circuits 55 are arranged on a pair of parallel sides, and second resonance circuits 59 are arranged on another pair of parallel sides so as to constitute a bridge circuit. An input terminal $IN_1$ is arranged between a pair of first resonance circuit 55 and second resonance circuit 59, and another input terminal $IN_2$ is arranged between another pair of first resonance circuit 55 and second resonance circuit 59. Likewise, an output terminal OUT1 is arranged between a pair of the first resonance circuit 55 and the second resonance circuit 59 and another output terminal OUT2 is arranged between another pair of the first resonance circuit 55 and the second resonance circuit 59.

The first resonance circuit 55 includes a first inductor 52 used as a resonator, a first variable capacity 54 of the serial arrangement that is connected in series to the first inductor 52, and a first variable capacity 53 of the parallel arrangement that is connected in parallel to the series-connected circuit of the first inductor 52 and the capacity 54.

Also, the second resonance circuit 59 includes a second inductor 57 used as a resonator, a second variable capacity 56 of the serial arrangement, which is connected in series to the second inductor 57, and a second variable capacity 58 of the parallel arrangement, which is connected in parallel to the series-connected circuit of the second inductor 57 and the variable capacity 56.

It is desirable to use an inductor formed by using, for example, a strip line having a low resistivity and a high Q value as each of the first and second inductors 52 and 57. The inductance of the first inductor 52 is set at, for example, 2.3 nH, and the inductance of the second inductor 55 is set at 9.3 nH.

Also, in order to measure the capacitance of the first and second variable capacities 54, 56 of the serial arrangement, arranged are capacities 60 and 69 whose capacitance is varied like the capacities 54, 56, and first monitor circuits 61, 70 for measuring the capacitance of the capacities 60, 69 are connected to the capacities 60, 69, respectively. The capacitance measured in the first monitor circuits 61, 70 is supplied to calibration circuits 62, 71 so as to be compared with the capacitance set in advance. If the measured capacitance does not reach a prescribed value, the MEMS type variable capacity element 1 having the capacity 54 and the capacity 60 formed in the same substrate is driven. Also, the MEMS type variable capacity element 1 having the capacity 56 and the capacity 69 formed in the same substrate is driven as described previously so as to tune the capacitance of each of the capacities 54, 56.

Likewise, in order to measure the capacitance of the first and second variable capacities 53 and 58, capacities 63, 66 whose capacitance is varied are arranged, and the first monitor circuits 61, 64 for measuring the capacitance of each of the capacities 63, 66 are connected to the capacities 60, 63, respectively. The capacitance measured in each of the first monitor circuits 61, 70 is supplied to calibration circuits 65, 67 so as to be compared with the capacitance set in advance, and where the measure capacitance does not reach a prescribed value, the MEMS type variable capacity element 1 having the capacity 53 and the capacity 63 formed in the same substrate and the MEMS type variable capacity element 1 having the capacity 58 and the capacity 66 formed in the same substrate are driven as described previously so as to tune the capacitance of each of the capacities 54, 58.

As described above, in order to move the movable head in a vertical direction while holding the movable head in parallel to the substrate in the MEMS type variable capacity equipped with the piezoelectric driving mechanism of the present invention, it is desirable to increase the bending rigidity of the movable head, to connect a plurality of piezoelectric driving mechanisms to each other via a neck section having a small bending rigidity, to arrange these piezoelectric driving mechanisms in a symmetric position with respect to any of a predetermined line, a point, and rotary plane. In general, the bending rigidity is proportional to three powers of the thickness and one power of the width. Thus, it is desirable to increase the thickness and width of the movable head and to decrease the thickness and width of the neck section. It is desirable for the ratio in the bending rigidity of the movable head to the neck section to be at least 1.5, and if possible, at least 3.

It is also possible to employ the construction shown in FIG. 4, i.e., the piezoelectric actuator structure of the called S-mode, in order to move the movable head in a vertical direction while holding the movable head in parallel to the substrate. In the S-mode piezoelectric actuator, arranged is a piezoelectric actuator of the same length having the polarity inverted in the longitudinal direction of the beam. In the stage of applying a driving voltage, one actuator is warped in a convex configuration, and the other actuator is warped in a concave configuration so as to cancel the inclination, with the result that the movable head can be moved in the vertical direction while holding the movable head parallel to the substrate.

Also, in order to control the movable electrodes of a plurality of variable capacities mounted in the movable head in the same fashion for operating the movable electrodes, it is desirable for the movable electrodes to be arranged at positions that are in symmetry to the piezoelectric driving mechanism with respect to a line, a point and the rotary plane.

Also, regarding the movable beam structure having a piezoelectric driving mechanism, it is possible to employ a so-called "unimorph structure" or an asymmetric "bimorph structure", i.e., a laminate structure of a piezoelectric film sandwiched between the upper and lower electrodes and a support film or a laminate structure of two piezoelectric films sandwiched between the upper and lower electrodes, which is called a bimorph structure.

Six Embodiment

Figure 12:
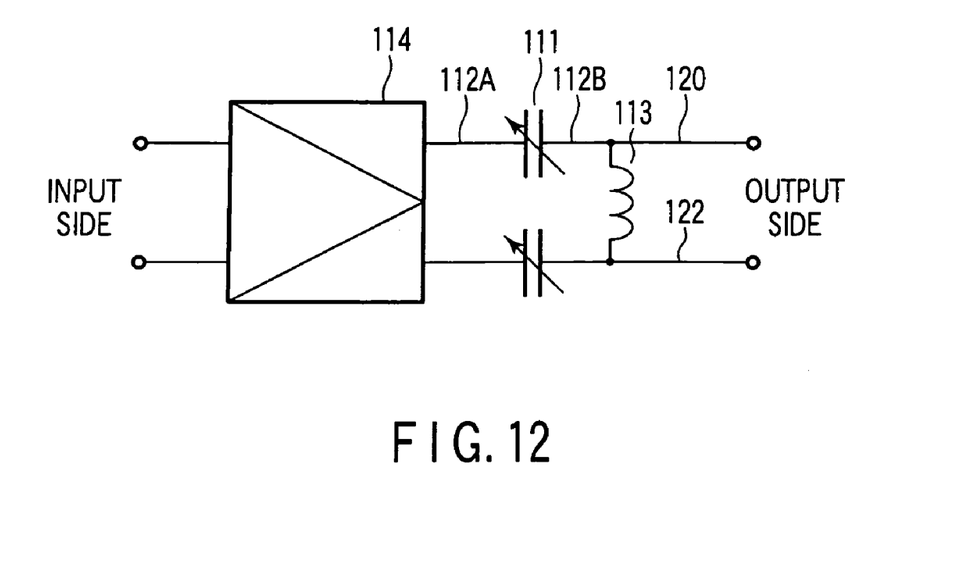
FIG. 12 is a block diagram showing the circuit having a variable capacity according to the third embodiment of the present invention applied to an LNA.

FIG. 12 is a circuit diagram, in which a MEMS type variable capacity or capacitor having a piezoelectric driving mechanism according to the third embodiment of the present invention is used in the tunable impedance matching circuit on the output side of a low noise amplifier (LNA).

As shown in the drawing, stationary electrode wirings 112A, 112B of the two variable capacities 111 are connected in series to an output side signal line 120 of the equilibrium output type LNA 114. Also, the stationary electrode wiring 112B is connected to an inductor 113 connected in parallel between the output signal lines 120 and 122 and having an inductance of 7 nH.

Figure 13:
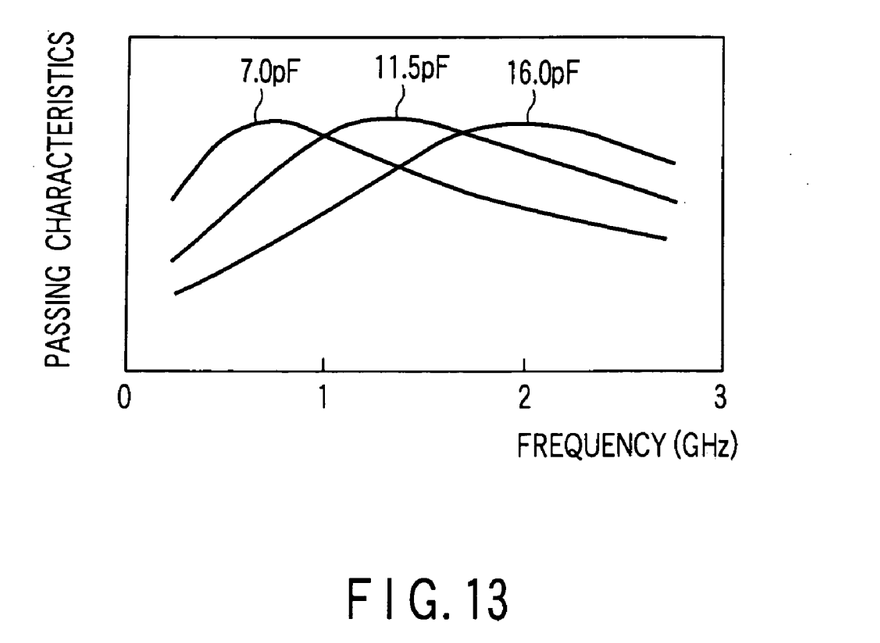
FIG. 13 is a graph showing the transmitting characteristics of LNA in the circuit shown in FIG. 12.

The passing characteristics were measured while varying the capacitance of the variable capacity 111 under the condition that the impedance on the input side and the output side was set at 50 Ω, with the result as shown in FIG. 13. As shown in FIG. 13, where the capacitance of the two variable capacities is about 70 pF, the maximum passing characteristics were obtained under the frequency of about 800 MHz. Where the capacitance noted above was about 115 pF, the maximum passing characteristics were obtained under the frequency of 1.5 GHz, and where the capacitance noted above was about 160 pF, the maximum passing characteristics were obtained under the frequency of 2.0 GHz.

As described above, it is possible to realize an equilibrium type amplifier provided with a tunable matching circuit, which permits an impedance matching over a very wide frequency range by using two variable capacities 111 having well aligned variable characteristics as the output impedance matching circuit of an equilibrium amplifier.

Incidentally, each of the Embodiments described above is simply intended to exemplify the apparatus and method for embodying the technical idea of the present invention. Needless to say, the technical idea of the present invention is not limited to the materials, shapes, constructions and arrangements of the constituting members of the apparatus disclosed in the Embodiments described above. In other words, the present invention can be modified in various fashions within the technical scope of the present invention.

According to the piezoelectric MEMS element structure of the present invention, the same characteristics can be obtained from a plurality of piezoelectric MEMS elements so as to make it possible to obtain a variable capacity including a control mechanism excellent in reproducibility and reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A piezoelectric MEMS element, comprising:
a substrate having a first surface;
a movable head having a second surface faced to the first surface;
first and second movable electrodes arranged on the second surface;
first and second pairs of stationary electrodes formed on the first surface, the first pair of stationary electrodes being arranged to face the first movable electrode with a gap and the second pair of stationary electrodes being arranged to face the second movable electrode with the gap; and
a driving beam structure configured to drive the movable head, the driving beam structure including a piezoelectric film generating a driving force, which is elongated from the movable head to the end of the driving beam structure in a longitudinal direction of the driving beam structure, the end of the driving beam structure being fixed to the substrate to support the movable head, first and second variable capacitors being formed between the first movable electrode and the first pair of stationary electrodes and between the second movable electrode and the second pair of stationary electrodes, and having first capacitance and second capacitance, respectively, the first capacitance and second capacitance being varied depending on the driving of the movable head.

2. The piezoelectric MEMS element according to claim 1, wherein the substrate include a recess having a flat inner surface and a peripheral region defining the recess, and the stationary electrode is arranged on the inner surface of the recess and the end of the driving beam structure is fixed to the peripheral region of the substrate.

3. The piezoelectric MEMS element according to claim 1, wherein each of the first and second variable capacitors includes capacities connected in series between each of the first and second movable electrode and each of the first and second pairs of the stationary electrodes.

4. The piezoelectric MEMS element according to claim 1, wherein the driving beam structure includes first and second electrode films configured to apply a voltage to the piezoelectric film, which extends in the longitudinal direction of the driving beam structure, and the piezoelectric film is interposed between the first and second electrode films.

5. The piezoelectric MEMS element according to claim 1, further comprising a wiring electrically connected to the stationary electrode and extending along the first surface.

6. A piezoelectric MEMS element, comprising:
a substrate having a first surface;
a movable head having a second surface facing the first surface;
movable electrodes which are substantially symmetrically arranged on the second surface with respect to the center point of the movable head;
pairs of stationary electrodes which are so formed and arranged on the first surface as to face the movable electrode with a gap, respectively; and
a driving beam structure configured to drive the movable head, the driving beam structure including first, second, third and fourth driving beams arranged in symmetry with respect to the center point of the movable head, each of the first, second, third and fourth driving beams including a piezoelectric film deforming the driving beam structure, which is elongated in a longitudinal direction of corresponding one of the driving beams from the movable head to the end of the corresponding driving beam, the ends of the first, second, third and fourth driving beams being fixed to the substrate to support the movable head, each of variable capacitors being formed between the movable electrode and the pair of stationary electrodes faced to the movable electrode, and having the capacitance which is varied depending on the driving of the movable head.

7. The piezoelectric MEMS element according to claim 6, wherein the substrate include a recess having a flat inner surface and a peripheral region defining the recess, and the stationary electrode is arranged on the inner surface of the recess and the ends of the first, second, third and fourth driving beams are fixed to the peripheral region of the substrate.

8. The piezoelectric MEMS element according to claim 6, wherein each of the variable capacitors includes two capacities connected in series between the movable electrode and each of the stationary electrodes.

9. The piezoelectric MEMS element according to claim 6, wherein each of the driving beams includes first and second electrode films configured to apply a voltage to the piezoelectric film, which extends in the longitudinal direction of the corresponding driving beam, and the piezoelectric film is interposed between the first and second electrode films.

10. The piezoelectric MEMS element according to claim 6, further comprising a wiring electrically connected to the stationary electrode and extending along the first surface.

11. A piezoelectric MEMS element, comprising:
a substrate having a first surface;
a movable head having a second surface faced to the first surface;
movable electrodes which are arranged on the second surface substantially in symmetry with respect to the center point of the movable head;
pairs of stationary electrodes which are so formed and arranged on the first surface as to face the movable electrodes with a gap, respectively; and
a driving beam structure configured to drive the movable head, including first and second driving beams which are extended in opposite directions to support the movable head, each of the first and second driving beams including a piezoelectric film generating a driving force, the piezoelectric element extending in a longitudinal direction of corresponding one of the first and second driving beams from the movable head to the end of the corresponding driving beam, variable capacitors being formed between the movable electrodes and the pairs of the stationary electrodes, respectively, and each of the variable capacitors having a capacitance which is varied depending on the driving of the movable head.

12. The piezoelectric MEMS element according to claim 11, wherein the substrate include a recess having a flat inner surface and a peripheral region defining the recess, and the stationary electrode is arranged on the inner surface of the recess and the ends of the first and second beams are fixed to the peripheral region of the substrate.

13. The piezoelectric MEMS element according to claim 11, wherein each of the variable capacitors includes two capacities connected in series between the movable electrode and each of the stationary electrodes.

14. The piezoelectric MEMS element according to claim 11, wherein each of the first and second driving beams includes first and second electrode films configured to apply a voltage to the piezoelectric film, which extends in the longitudinal direction of the corresponding driving beam, and the piezoelectric film is interposed between the first and second electrode films.

15. The piezoelectric MEMS element according to claim 11, further comprising a wiring electrically connected to the stationary electrode and extending along the first surface.

16. The piezoelectric MEMS element according to claim 11, wherein the first and second driving beams are arranged substantially in symmetry with respect to the center point of the movable head.

17. A tunable filter, comprising:
input-output line and a ground line;
first resonance circuits connected in series to the input-output line, including a first resonator connected to the input-output line, a first variable capacity connected in parallel to the first resonator, and a second variable capacity connected in series to the first resonator and to the first variable capacity,
said the first and second variable capacitors being formed of first and second piezoelectric MEMS elements, and each of the first and second piezoelectric MEMS elements comprising:
a first substrate having a first surface;
a first movable head having a second surface faced to the first surface;
first movable electrodes which are arranged on the second surface;
pairs of first stationary electrodes which are so formed and arranged on the first surface as to face the first movable electrodes with a first gap, respectively; and
a first driving beam structure configured to drive the first movable head, the driving beam structure including a first piezoelectric film generating a driving force, which is elongated from the movable head to the end of the driving beam structure in a longitudinal direction of the first driving beam structure, the end of the first driving beam structure being fixed to the substrate to support the movable head, the first and second variable capacitors being formed between the first movable electrodes and the pairs of the first stationary electrodes, respectively, and each of the first and second variable capacitors having the capacitance which is varied depending on the driving of the first movable head; and
a second resonance circuits arranged between the first resonance circuits and connected between the input-output line and the ground line and including a second resonator connected between the input-output line and the ground line, a third variable capacity connected in parallel to the second resonator, and a fourth variable capacity connected in series to the second resonator and to the third variable capacity,
said third and fourth variable capacitors being formed of third and fourth piezoelectric MEMS elements, and each of the third and fourth piezoelectric MEMS element comprising:
a second substrate having a third surface;
a second movable head having a fourth surface faced to the third surface;
second movable electrodes which are arranged on the fourth surface;
pairs of second stationary electrodes which are so formed and arranged on the third surface as to face the second movable electrodes with a second gap, respectively; and
a second driving beam structure configured to drive the movable head, the driving beam structure including a second piezoelectric film generating a driving force, which is elongated from the movable head to the end of the second driving beam structure in a longitudinal direction of the second driving beam structure, the end of the first driving beam structure being fixed to the substrate to support the movable head, the third and fourth variable capacitors being formed between the second movable electrodes and the pairs of the second stationary electrodes, respectively, and each of the third and fourth variable capacitors having the capacitance which is varied depending on the driving of the second movable head.

18. A tunable filter, comprising:
first and second input terminals;
first and second output terminals;
a bridge circuit including first and second resonance circuits connected between the first input terminal and first and second output terminals and third and fourth resonance circuits connected between the second input terminal and the first and second output terminals, each of the first to fourth resonance circuits being formed of a resonator, a first variable capacity connected in series to the resonator, and a second variable capacity connected in parallel to the series circuit of the resonator and the first variable capacity, the first variable capacity included in each of the first to fourth resonance circuits being formed of a first piezoelectric MEMS element, the first variable capacity included in each of the second and third resonance circuits being formed of a second piezoelectric MEMS element, a second variable capacity included in each of the first and fourth resonance circuits being formed of a third piezoelectric MEMS element, and the second variable capacity included in each of the second and third resonance circuits being formed of a fourth piezoelectric MEMS element, each of the first, second, third and fourth piezoelectric MEMS elements comprising:

a substrate having a first surface;

a movable head having a second surface faced to the first surface;

movable electrodes which are arranged on the second surface;

pairs of stationary electrodes which are so formed and arranged on the first surface as to face the movable electrodes with a gap, respectively; and a driving beam structure configured to drive the movable head, which are extended in opposite directions to support the movable head, each of the first and second driving beams including a piezoelectric film generating a driving force, the piezoelectric element extending in a longitudinal direction of corresponding one of the first and second driving beams from the movable head to the end of the corresponding driving beam, the first to fourth variable capacitors being formed between the movable electrodes and the pairs of the stationary electrodes, respectively, and each of the first and second variable capacitors having the capacitance which is varied depending on the driving of the movable head.

19. The tunable filter according to claim 18, wherein each of the first to fourth piezoelectric MEMS elements further includes a third variable capacity arranged between the movable electrode and the stationary electrode, and the tunable filter further comprises a tuning circuit monitoring the capacitance of the third capacity and driving the first to fourth piezoelectric MEMS elements so as to tune the capacitance of the corresponding variable capacity.

* * * * *